(12) United States Patent
Zhang et al.

(10) Patent No.: US 9,787,928 B2
(45) Date of Patent: Oct. 10, 2017

(54) LAYOUT AND TIMING SCHEMES FOR PING-PONG READOUT ARCHITECTURE

(71) Applicant: Forza Silicon Corporation, Pasadena, CA (US)

(72) Inventors: Dexue Zhang, Arcadia, CA (US); Yingying Wang, Solon, OH (US); Loc Truong, Huntington Beach, CA (US); Steven Huang, Pasadena, CA (US)

(73) Assignee: Forza Silicon Corporation, Pasadena, CA (US)

( * ) Notice: Subject to any disclaimer, the term of this patent is extended or adjusted under 35 U.S.C. 154(b) by 0 days.

(21) Appl. No.: 14/989,067

(22) Filed: Jan. 6, 2016

(65) Prior Publication Data

US 2016/0198114 A1 Jul. 7, 2016

Related U.S. Application Data

(60) Provisional application No. 62/100,459, filed on Jan. 6, 2015.

(51) Int. Cl.
*H04N 5/378* (2011.01)
*H04N 5/357* (2011.01)
*H04N 5/374* (2011.01)
*H01L 27/146* (2006.01)

(52) U.S. Cl.
CPC ....... *H04N 5/378* (2013.01); *H01L 27/14623* (2013.01); *H04N 5/3575* (2013.01); *H04N 5/3577* (2013.01); *H04N 5/374* (2013.01)

(58) Field of Classification Search
CPC .... H04N 5/378; H04N 5/3575; H04N 5/3742; H04N 5/361; H04N 5/374; H04N 5/357; H04N 5/3658; H04N 5/335; H04N 5/3653; H04N 5/363; H04N 5/37452; H04N 5/37455; H01L 27/14609; H01L 27/14643; H01L 27/14641; H01L 27/14623; H01L 27/1463; H01L 27/14636; G09G 2310/0245–2310/0259; G11C 27/024
See application file for complete search history.

(56) References Cited

U.S. PATENT DOCUMENTS

| | | | | |
|---|---|---|---|---|
| 5,838,176 A * | 11/1998 | Delbruck | ............. | G11C 27/024 327/91 |
| 6,483,493 B2 * | 11/2002 | Murade | ................. | G02F 1/1345 345/100 |
| 6,977,684 B1 * | 12/2005 | Hashimoto | ....... | H01L 27/14603 250/208.1 |
| 7,274,345 B2 * | 9/2007 | Imamura | ............. | G09G 3/3233 345/204 |
| 7,538,804 B2 * | 5/2009 | Okita | ................ | H01L 27/14603 257/659 |
| 7,545,419 B2 * | 6/2009 | Kakumoto | ........... | H04N 5/3653 348/243 |

(Continued)

*Primary Examiner* — Michael Osinski
(74) *Attorney, Agent, or Firm* — Mountain IP, PLLC

(57) ABSTRACT

Ping-pong readout architecture allows for faster frame rates in CMOS image sensors. However, various problems are created by this architecture due to cross-talk between components. Provided herein are novel ping-pong readout layouts which better isolate components to reduce crosstalk issues. Also provided herein are novel timing schemes for operating ping-pong readout circuits which prevent crosstalk signal spikes or readout corruption.

6 Claims, 5 Drawing Sheets

(56) References Cited

U.S. PATENT DOCUMENTS

| | | | | |
|---|---|---|---|---|
| 7,990,440 B2* | 8/2011 | Kobayashi | H04N 5/3575 | 348/241 |
| 7,999,866 B2* | 8/2011 | Sonoda | H04N 5/361 | 348/241 |
| 8,004,590 B2* | 8/2011 | Koseki | H04N 5/378 | 250/208.1 |
| 8,138,804 B2* | 3/2012 | Chou | H04N 5/3575 | 327/94 |
| 8,309,898 B2* | 11/2012 | Kato | H01L 27/14621 | 250/208.1 |
| 8,797,435 B2* | 8/2014 | Koizumi | H04N 3/1575 | 348/300 |
| 8,823,849 B2* | 9/2014 | Hiyama | H04N 5/3651 | 348/308 |
| 8,878,971 B2* | 11/2014 | Ryoki | H04N 5/3575 | 348/245 |
| 9,258,498 B2* | 2/2016 | Wuen | H04N 5/3575 | |
| 2003/0214591 A1* | 11/2003 | Kakumoto | H04N 5/378 | 348/243 |
| 2003/0218117 A1* | 11/2003 | Hiyama | H01L 27/12 | 250/208.1 |
| 2004/0257353 A1* | 12/2004 | Imamura | G09G 3/3233 | 345/204 |
| 2005/0098805 A1* | 5/2005 | Okita | H01L 27/14603 | 257/292 |
| 2005/0168618 A1* | 8/2005 | Okita | H01L 27/14603 | 348/335 |
| 2006/0249765 A1* | 11/2006 | Hsieh | H01L 27/14609 | 257/292 |
| 2008/0062294 A1* | 3/2008 | Koizumi | H04N 3/1575 | 348/300 |
| 2008/0225145 A1* | 9/2008 | Sonoda | H04N 5/3456 | 348/294 |
| 2008/0291290 A1* | 11/2008 | Sonoda | H04N 5/361 | 348/222.1 |
| 2009/0040351 A1* | 2/2009 | Cho | H04N 5/3575 | 348/308 |
| 2009/0309033 A1* | 12/2009 | Cho | H04N 5/363 | 250/370.08 |
| 2011/0149135 A1* | 6/2011 | Yamanaka | H04N 5/335 | 348/302 |
| 2012/0099010 A1* | 4/2012 | Sugiyama | H01L 27/14609 | 348/294 |
| 2012/0119070 A1* | 5/2012 | Ryoki | H04N 5/3575 | 250/208.1 |
| 2012/0314109 A1* | 12/2012 | Murakami | H01L 27/14603 | 348/300 |
| 2014/0263969 A1* | 9/2014 | Mayer | H04N 5/37206 | 250/208.1 |
| 2014/0320717 A1* | 10/2014 | Hiyama | H04N 5/378 | 348/308 |
| 2014/0340552 A1* | 11/2014 | Wuen | H04N 5/3575 | 348/302 |
| 2015/0009386 A1* | 1/2015 | Komaba | H03M 1/56 | 348/308 |
| 2015/0077611 A1* | 3/2015 | Yamashita | H04N 5/3559 | 348/308 |
| 2016/0044259 A1* | 2/2016 | Takado | H04N 5/378 | 348/297 |
| 2016/0234451 A1* | 8/2016 | Otaka | H04N 5/378 | |

* cited by examiner

LAYOUT AND TIMING SCHEMES FOR PING-PONG READOUT ARCHITECTURE

CROSS-REFERENCE TO RELATED APPLICATIONS

This application claims the benefit of priority to U.S. Provisional Application Ser. No. 62/100,459 entitled "Improved Timing and Layout Schemes for Ping-Pong Readout Architecture," filed Jan. 6, 2015, the contents of which are hereby incorporated by reference.

REFERENCE TO SEQUENCE LISTING, A TABLE, OR A COMPUTER PROGRAM LISTING COMPACT DISK APPENDIX

Not Applicable.

STATEMENT REGARDING FEDERALLY SPONSORED RESEARCH OR DEVELOPMENT

Not Applicable.

BACKGROUND AND SUMMARY OF THE INVENTION

In a typical CMOS image sensor readout circuit, there is only one pair of sample-and-hold circuits for storing the sampled reset and pixel signal values output by a selected row. These two sample-and-hold circuits are read out sequentially, with either the pixel signal level ("PIX") read out first, followed by the reset level ("RST"), for example as is typical in a 3-T pixel readout scheme, or RST read out first, followed by PIX, for example as is typical in a 4-T pixel readout scheme. Readout is performed column-by-column.

To increase the readout speed for high resolution image sensors, the ping-pong readout architecture can be adopted. The ping-pong readout architecture has two pairs of sample-and-hold circuits per column, for example as depicted in FIG. 1. In alternating phases, each pair of sample and hold capacitors will act as the "sampling pair" while the other, opposing pair acts as the "output pair," as follows. For example, referring to FIG. 1, in a first phase, the PIX and RST signals for a given row, row n, are sequentially output from the pixel to a pixel output line (101). By operation of switches (104 and 105), these signals are sampled and held on a first pair of capacitors (102 and 103), during which such phase this first pair acts as the sampling pair. After this first phase, in a second phase, the first sample and hold capacitor pair (102 and 103) becomes the output pair and, by the action of switches (106 and 107) the sampled PIX and RST signals are output to respective PIX and RST signal bus lines (114 and 115). During this second phase, the second pair of sample and hold capacitors (108 and 109) acts as the sampling pair and receives, by the action of switches (110 and 111), and stores PIX and RST signals sequentially output from row n+1 to the pixel output line (101). This operation is followed by a third phase, wherein the first pair of sample and hold capacitors (102 and 103) again becomes the sampling pair, receiving PIX and RST signals from row n+2 while the second pair acts as the output pair, by the action of switches (112 and 113), outputting stored signals from row n+1 to the RST and PIX signal bus lines (114 and 115). The RST and PIX signal bus lines may input to a signal processing or storage element, for example an ADC, data buffer, or memory element.

Because there are two pairs of sample-and-hold capacitors, the ping-pong architecture allows the simultaneous readout of one row during the sample- and hold phase of the next row. The overlapping timing of these operations decreases the time necessary for reading out each row and increases the frame rate. Accordingly, this ping-pong architecture advantageously allows high speed operations, for example in global shutter or extremely high frame rate cameras.

The use of a ping-pong architecture has certain shortcomings and complications. First, adding the second pair of sample-and-hold circuits will increase the height of the circuit as well as adding extra control signals for selecting between the two sample- and hold pairs. Second, if the column readout pitch stays the same as pixel pitch, twice as many column readout select signals need to be placed into a single column, which results in increased parasitic capacitance among components. For example, a crowded column output architecture results in increased parasitic capacitance between the pixel output line and the sample-and-hold capacitor top plates, and between the sample-and-hold top plates and the readout output line. A third issue in ping-pong architecture is that the readout timing scheme becomes more complicated because of the overlap between previous row's readout and the next row's sample-and-hold phases. Big crosstalk spikes or missing codes may be produced in the neighboring readout circuit due to the parasitic capacitances caused by nearby operations.

Presented herein is a modified ping-pong architecture which addresses the shortcomings of typical designs. Described herein are novel layouts for ping-pong architecture, which isolate sensitive components from sources of capacitance or other interference. Also disclosed are improved timing regimes that help prevent the problematic crosstalk and parasitic capacitance issues inherent in ping-pong architecture.

BRIEF DESCRIPTION OF THE DRAWINGS

FIG. 3A depicts control signal timing and signal levels for readout components in a standard ping-pong readout architecture. FIG. 3B depicts control signal timing and signal levels for components in an improved ping-pong readout scheme of the invention.

FIG. 4A depicts control signal timing and signal levels for readout components in a standard ping-pong readout architecture. FIG. 4B depicts control signal timing and signal levels for an improved ping-pong readout scheme of the invention.

DETAILED DESCRIPTION OF THE INVENTION

Figure 1:
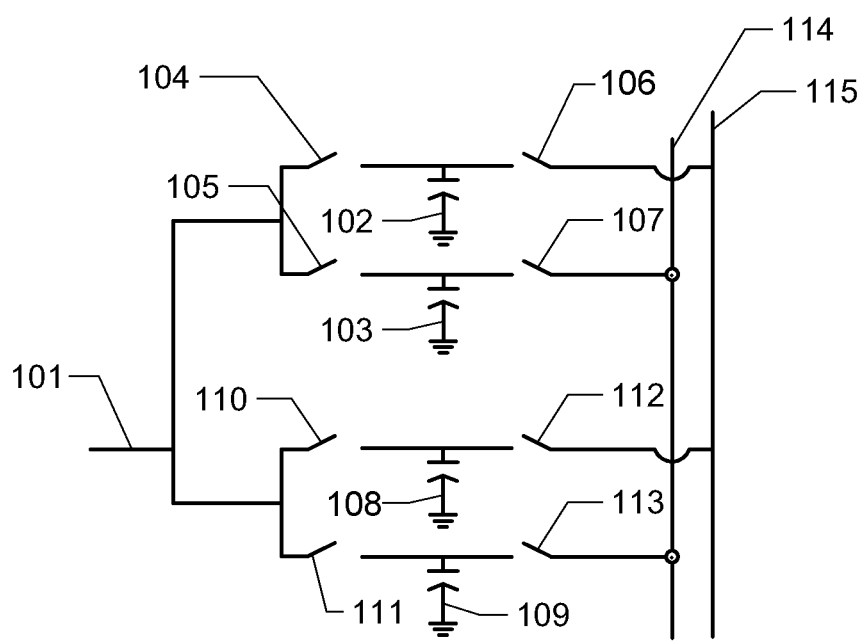
FIG. 1 depicts a standard pin-pong readout architecture with two pairs of sample and hold capacitors.

The scope of the invention encompasses various improvements for ping-pong readout architecture.
Layout and Shielding.

In one aspect, the invention is directed to improvements in the layout of ping-pong readout circuits, wherein isolation of components is used to alleviate various shortcomings of the prior art. In image sensors using ping-pong readout architecture, the spike/band or missing code created by crosstalk is mostly due to coupling capacitances which affect the readout data buses. This problem is exacerbated in small-sized column pitches.

As used herein, "controllably connected" means, upon the application of a control signal, an element can be connected to a signal line such that a signal is received by the element from the signal carrying line or is output from the element to the signal carrying line, as the case may be. Typically, controllably connected means that a switch or gate is opened or closed to disconnect or to connect the element to the signal line. Switching elements may comprise any switching element known in the art, for example, CMOS switching elements, for example bipolar junction transistor circuits, field effect transistor circuits, and metal oxide semiconductor including either p-type or n-type, and complementary transistor pair arrangements such as transmission gates.

The sample and hold capacitors of the circuits of the invention may comprise any capacitor element known in the art, for example, metal plate capacitors and polysilicon-based capacitors. Multiple capacitors can be combined to obtain the desired values.

Shielding, as used herein, may refer to any shielding material and structure known in the art, for example metal and polysilicon shielding materials and structures. Shielding structures are usually conductive and connected to power or ground, or a "clean" (i.e. relatively noise free) reference voltage. Shielding effectiveness can be increased by using multiple stacked metal layers and/or by adding vias to the shielding structure.

It will be understood that the ping-pong readout circuit of the invention overlays and/or is overlaid by a pixel array, i.e. an array of image sensor elements, for example a CMOS pixel array. The pixels of the pixel array are capable of outputting two signals, an RST signal corresponding to the pixel's reset level (after a reset operation and before integration of photo-induced charge), and a FIX signal corresponding to the photo-integrated charge. Under the control of clocks and signal lines, each row of the array will be sequentially read out, such that the pixel will output the PIX and RST signals, sequentially, to a pixel output line which is vertically oriented and is in connection with the underlying ping-pong readout circuit.

The function of the ping-pong readout circuit is to store the PIX and RST signals from each pixel in the selected row above it (or below it, as the case may be), and then to feed these stored signals to an ADC, or other signal processing or storage means, where correlated double sampling operations can be performed by subtracting the RST value from the PIX value to yield a corrected PIX signal value.

In one embodiment, the invention comprises a novel ping-pong readout circuit layout. In this layout, two side-by-side readout circuit columns are flanked by one or more dummy columns on each side. Each of the two side-by-side readout columns serves an overlaying column of pixels from the pixel array above. Each readout column comprises: a first and a second pair of sample and hold capacitors, each pair comprising a sample and hold capacitor that will store the PIX and RST signals from a pixel in the selected row in the overlaying pixel array. Each readout column further comprises a pixel output line which, above, is controllably connected to pixels in each row above, and within the ping-pong readout circuit is controllably connected to each sample-and-hold capacitor, for example, the top plate of each sample and hold capacitor. The readout columns each further comprise a pair of signal lines which connect to switches, gates, or like elements which can controllably connect the sample and hold capacitor to signal output lines.

The ping-pong readout circuit of the invention further comprises horizontal lines which cross the two readout columns. The signal lines comprise signal lines which activate the switches or gates that connect each sample and hold capacitor to the pixel output lines, such that sample and hold capacitors can receive signal inputs from overlaying pixels. The horizontal signal lines also comprise signal lines that carry signals from the sample and hold capacitor to vertical signal bus lines in connection with ADC's, or other signal processing or storage elements.

Figure 2:
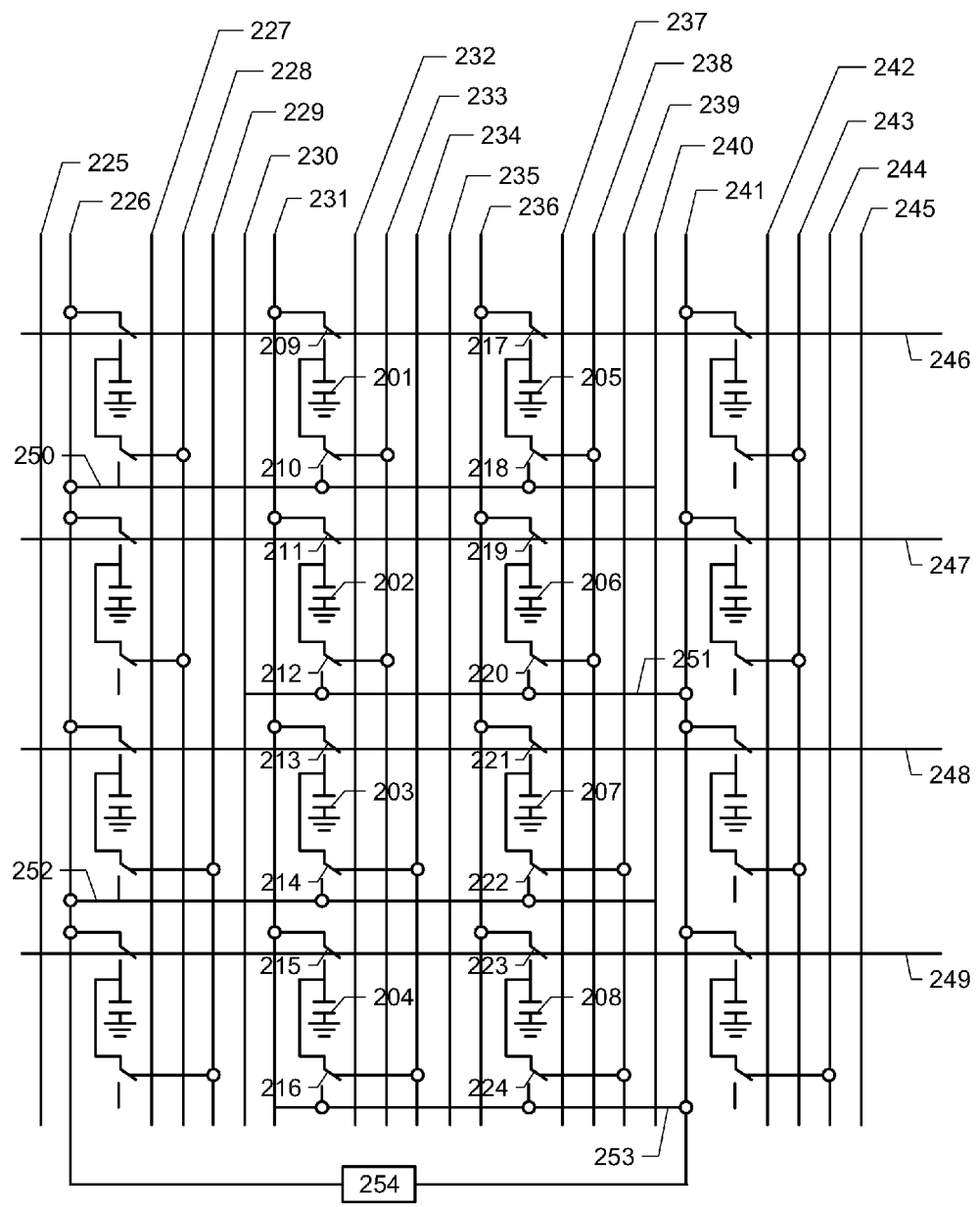
FIG. 2 depicts an exemplary ping pong layout of the invention wherein a pair of side-by-side readout columns is flanked by a dummy column on each side.

The dummy columns which flank the side-by-side readout columns comprise a single signal bus line, and one or more lines of shielding. For example, in the four column configuration, for example as depicted in FIG. 2, one dummy column comprises the PIX signal bus and the other dummy column comprises the RST signal bus. The dummy columns further comprise at least two lines of shielding. One or more lines of shielding isolate the dummy column from the readout column it is adjacent to. For example, three lines of shielding may be used to isolate the signal bus in the dummy column from the adjacent readout column. Within the dummy column, on the other side of the signal bus, one or more lines of shielding isolate the signal bus from the adjacent column in the adjacent ping-pong readout circuit. If any pixel output or column select lines are present in the dummy column, these are set to ground.

The novel ping-pong readout layout further comprises one or more vertical lines of shielding between each column, including between dummy columns and readout columns and between the side-by-side readout columns.

The pitch of the columns within the novel layout of the invention may vary. In one embodiment, pitch is equal to half that of the pixel column, such that four columns (for example as depicted in FIG. 2) may underlay two pixel columns. In another embodiment, there are readout circuits arranged above and below the pixel columns in a top and bottom configuration, and each column of the readout circuit may comprise the same pitch as the pixels columns. In another embodiment, the pitch of the readout columns is less than that of a pixel column and more than one readout columns may underlay/overlay each pixel column, for example in architectures where multiple (two or more) dummy columns flank the readout columns on each side.

An exemplary ping-pong layout of the invention is depicted in FIG. 2. The ping-pong layout of FIG. 2 comprises two side-by-side readout columns. In the first column, column n, two pairs of sample and hold capacitors are present. The first pair comprises sample and hold capacitors 201 and 202, which store RST and PIX signals, respectively. The second pair comprises sample and hold capacitors 203 and 204, which store RST and PIX signals, respectively. The pixel output line for column n (231) is controllably connected to the sample and hold capacitors by switches 209, 211, 213, and 215. The RST sample and hold capacitors in column n (201 and 203) are controllably connected to the RST signal bus line 226 via horizontal signal lines (250 and 252) by switches 210 and 214 which are operated by horizontal control lines 246 and 248. The PIX sample and hold capacitors in column n (202 and 204) are controllably connected to the PIX signal bus line 241 via horizontal signal lines (251 and 253) by switches 212 and 216 which are operated by horizontal control lines 247 and 249. A vertical line of shielding 232 isolates the sample and hold capacitors from column select line 233 which selects the first pair of sample-and-hold capacitors (201 and 202) for readout and column select line 234 which selects the second pair of sample-and-hold capacitors (203 and 204) for readout.

Adjacent to column n is column n+1, which has an identical layout. Readout column n+1 comprises two pairs of sample and hold capacitors are present. The first pair comprises sample and hold capacitors 205 and 206, which store RST and PIX signals, respectively. The second pair comprises sample and hold capacitors 207 and 208, which store RST and PIX signals, respectively. The pixel output line for column n+1 (236) is controllably connected to the sample and hold capacitors by switches 217, 219, 221, and 223. The RST sample and hold capacitors in column n (205 and 207) are controllably connected to the RST signal bus line 226 via horizontal signal lines (250 and 252) by switches 218 and 222 which are operated by horizontal control lines 246 and 248. The PIX sample and hold capacitors in column n (206 and 208) are controllably connected to the PIX signal bus line 241 via horizontal signal lines (251 and 253) by switches 220 and 224 which are operated by horizontal control lines 247 and 249. A vertical line of shielding 237 isolates the sample and hold capacitors from column select line 238 which selects the first pair of sample-and-hold capacitors (205 and 206) for readout and column select line 239 which selects the second pair of sample-and-hold capacitors (207 and 208) for readout.

Each readout column is flanked by a dummy column. The dummy column adjacent to readout column n comprises the RST signal bus line 226, which is isolated from column n by three lines of shielding 227, 228, and 229. The dummy column adjacent to readout column n+1 comprises the PIX signal bus line 241, and further comprises three lines of shielding 242, 243, and 244. The FIX and RST signal bus lines (241 and 226) connect to a data processing or storage element (254) such as an ADC, data buffer, or memory.

A line of shielding separates each of the columns from its neighboring column (225, 230, 235, 240, and 245).

The layout architecture of the invention, for example as presented in FIG. 2, avoids breaking layout pattern of the array and provides excellent isolation of the RST and PIX data buses by multiple lines of shielding between these buses and other components. The pixel output line in each column is also isolated by vertical shielding lines on both sides. Additional shielding may be added on the top and bottom of the pixel output line to further improve its isolation. The column selection controls signals are placed together and separated from the pixel output line by one ground shielding line. The four horizontal lines may also be shielded by adding shielding above or underneath, connected to ground. The extra shielding between each prevents the parasitic capacitance and crosstalk that is common to prior art ping-pong architectures.

The coupling capacitance between drain and source of each column selection switch (normally an NMOS transistor) is relatively small, for example being in the range of 0.01~1 fF. However, this coupling capacitance can affect other components. If the pixel output settling curve's slope for the first pair of sample and hold capacitors is too steep, it will be coupled through this small coupled capacitor and will corrupt the readout of the second pair of sample and hold capacitors. Therefore, adding shielding between source and drain of column selection switches may be used to avoid this problematic coupling. It is also advantageous to add source and drain shielding for the pixel sampling switches as well. "L"-shape shielding connected to ground may also be added between the drain and source of the column selection switches to minimize the coupling in these components.

The shielding utilized in the readout circuit designs of the invention may be any type of shielding known in the art. For example, interconnection layers, including metal and polysilicon, can be used as shielding lines.

In operation, the novel ping-pong readout circuits of the invention function in standard ping-pong readout manner, with one pair of sample and hold capacitors in each readout column receiving and storing signals from a selected row of pixels while the other pair outputs previously stored signals to the ADC, data buffer, or other signal processing or storage elements.

Figure 5:
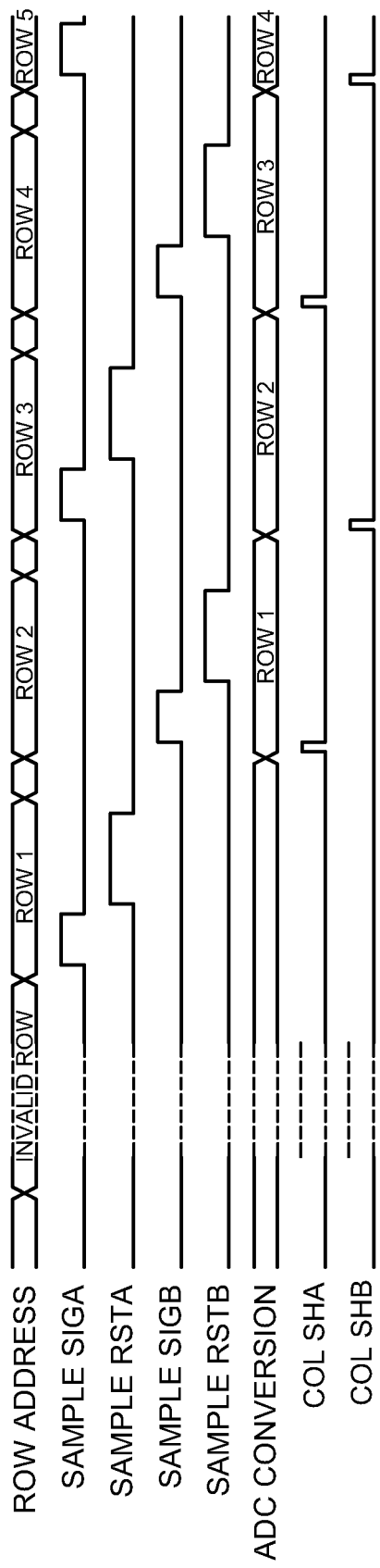
FIG. 5 is a timing diagram for the operation of a ping-pong readout column circuit of the invention.

FIG. 5 is a timing diagram for the operation of a single ping-pong readout column circuit of the invention. "Sample SigA" is the control signal which connects the PIX sample-and-hold capacitor of the first sample-and-hold capacitor pair to the pixel output line. "Sample RstA" is the control signal which connects the RST sample-and-hold capacitor of the first sample-and-hold capacitor pair to the pixel output line. "Sample SigB" is the control signal which connects the PIX sample-and-hold capacitor of the second sample-and-hold capacitor pair to the pixel output line. "Sample RstB" is the control signal which connects the RST sample-and-hold capacitor of the second sample-and-hold capacitor pair to the pixel output line. "Col SHA" is the control signal which connects each of the capacitors in the first pair of sample and hold capacitors to its respective PIX or RST bus line. "Col SHB" is the control signal which connects each of the capacitors in the second pair of sample and hold capacitors to its respective PIX or RST bus line.

MUX Topology.

In ping-pong readout circuit using hierarchy MUX topology, if the idle readout bus is clamped to the common mode voltage, it will solve common mode settling issues and break the cross talking path between the "ping" and "pang" phases as well. Shielding should be added between the input and output of the MUX to reduce coupling effects.

Timing Improvements.

One strategy for limiting crosstalk in the ping-pong architecture is to use a high speed clock to fine-tune the sampling phase timing performed on one pair of capacitors with the readout phase performed on the opposing pair of capacitors. For example, when the column select switches for the first pair of sample and hold capacitors within a readout column are turned on, previously sampled and held RST and PIX signals for a row are read out to the ADC or other data storage or processing means. Simultaneously, RST and PIX signals output from the next row are being sampled and held onto the SHB capacitors. Due to the capacitive coupling between the pixel output line and column select line, the pixel output will show a transient coupling caused by the column select pulse. If the pixel output is sampled, for example on SHA capacitors, before the coupling settles, a sampling error will be generated on the first pair of capacitors while the second pair of capacitors is read out.

Figure 3A:
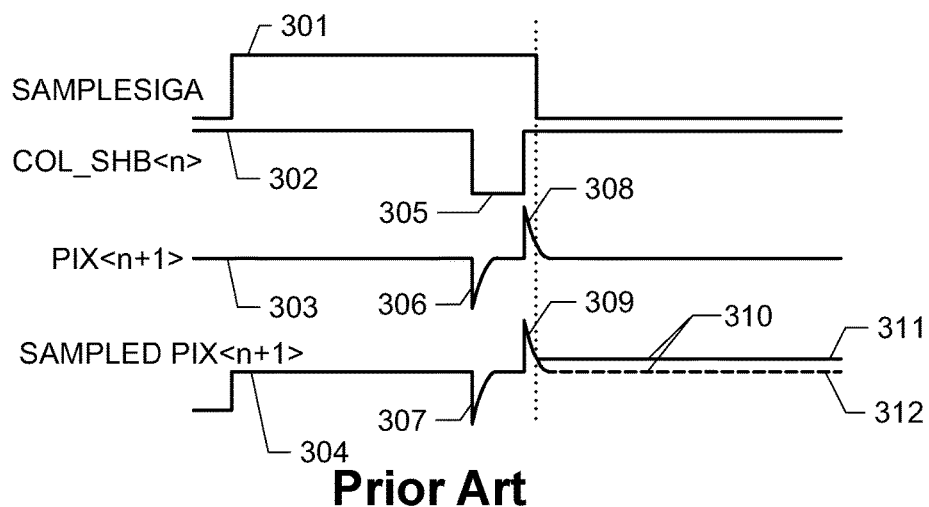
FIGS. 3A and 3B.

For example, control signals and sample signals in a standard ping-pang operation are depicted in FIG. 3A. In FIG. 3A, the control signal (301) for sampling a pixel signal onto a capacitor in the first pair of sample and hold capacitors is asserted and turned off. Meanwhile, the control signal (302) for outputting stored signals on the opposing pair of sample-and-hold capacitors to the output data bus is asserted for a brief time interval (305). This creates a pair of crosstalk spikes (306 and 308) in the pixel output line (303) which is sampling to the first pair of capacitors. The resulting sampled signal (304) on the first capacitor is offset by the crosstalk spike (309), resulting in an error (310) between the correct value (312) and the sampled value (311).

Figure 3B:
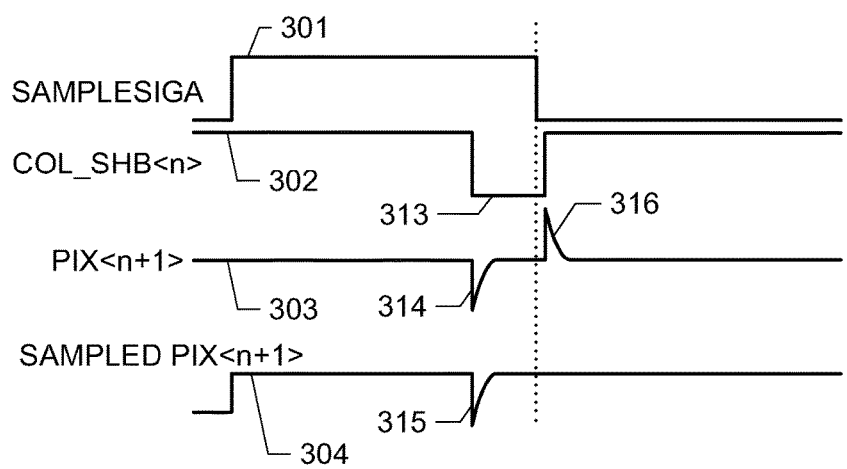

One way to avoid this occurrence is to fine-tune the falling edge of sample signal and reset control signals with a high-speed clock so that the coupling settles out before it is sampled. In one embodiment, the falling edge of sample signal is fine-tuned to avoid crosstalk in the ping-pong readout. For example, in FIG. 3B, the time interval (313) during which column select signal for the second pair of capacitors (302) is asserted is delayed until after the sampling of the capacitor from the first pair is complete. Thus, the second crosstalk spike created in the pixel output line (316) occurs after sampling of the pixel is completed, and this crosstalk spike does not carry through to the sampled signal (304), avoiding the error.

In one embodiment, the invention comprises the operation of a ping-pong readout scheme wherein the column select signal in the second set of capacitors is turned off after the sampling phase has been completed in the first pair of capacitors.

Another strategy for limiting crosstalk in ping-pong architecture is to tune the timing of the sampling operations to avoid capacitive coupling from pixel lines to readout buses (RST and SIG) by using high speed clock. At the rising/falling edges of the signals sampled by the sample and hold capacitors, for example on the first pair of sample-and-hold capacitors, the capacitor voltages will show a transient rising/falling trend caused by the output swing of the pixel source follower, before settling. This swing in the SHA capacitors could couple to the readout buses (RST and SIG), corrupting the readout of the second pair of capacitors which is occurring at the same time.

Figure 4A:
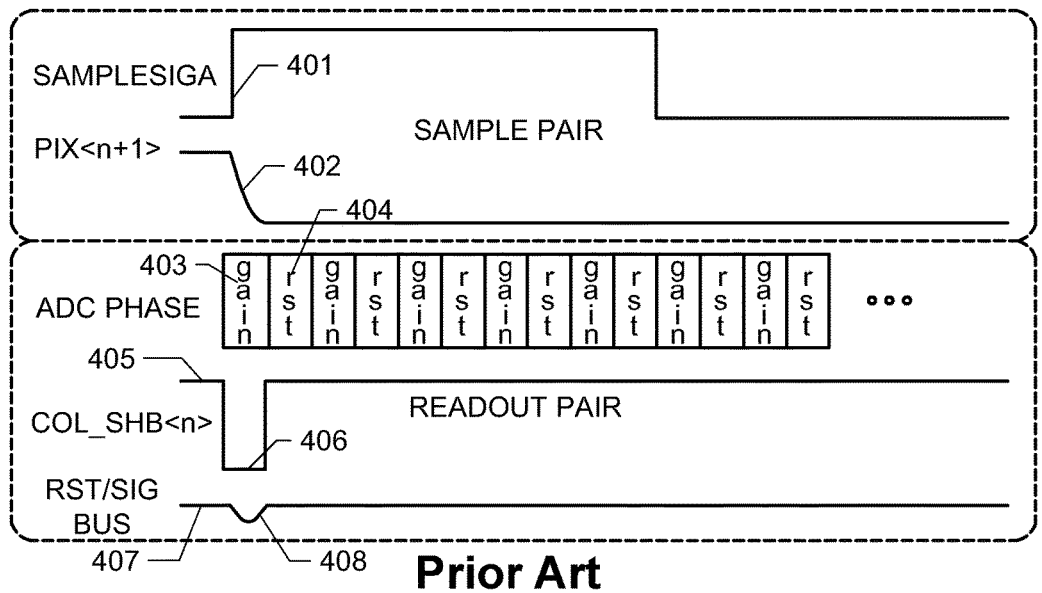
FIG. 4A and FIG. 4B.

For example, exemplary control and signal line signals in a standard prior art ping-pong readout are depicted in FIG. 4A. Here, the control signal (401) for sampling pixel output to the first set of capacitors is asserted during the gain phase of ADC operation (403). Simultaneously, the column select control signal 405 for the second set of capacitors is asserted for an interval of time (406). The resulting crosstalk between the pixel output line and the signal bus creates a transient spike (408) which will introduce error into the ADC read.

Figure 4B:
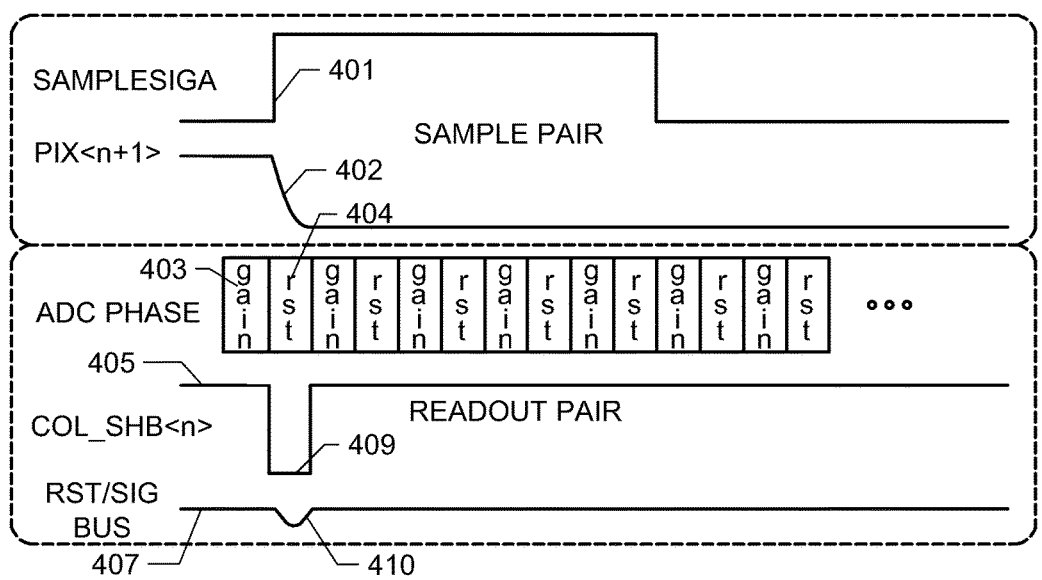

One way to avoid this is to set the readout circuit of SHB capacitors in reset mode during the time that the SHA sample-and-hold switches are turned on and off, so that the overlap of sample-and-hold edges in SHA and readout enabled stages in SHB is avoided, reducing the crosstalk in ping-pong operation. For example, as depicted in FIG. 4B, the control signal (405) for the second set of capacitors is asserted for an interval of time (409) during ADC rest phase (404), such that the crosstalk spike between the pixel output and signal bus (410) does not introduce an error in the ADC read.

In one embodiment, the invention comprises the operation of a ping-pong readout wherein the simultaneous sampling on the first pair of capacitors and readout of the second pair of capacitors is performed while the ADC is in reset phase.

All patents, patent applications, and publications cited in this specification are herein incorporated by reference to the same extent as if each independent patent application, or publication was specifically and individually indicated to be incorporated by reference. The disclosed embodiments are presented for purposes of illustration and not limitation. While the invention has been described with reference to the described embodiments thereof, it will be appreciated by those of skill in the art that modifications can be made to the structure and elements of the invention without departing from the spirit and scope of the invention as a whole.

What is claimed is:

1. A ping-pong readout circuit comprising:
   two side-by-side readout columns, wherein each column comprises two pairs of sample and hold capacitors and is configured to operate in ping-pong readout mode wherein a first pair of sample and hold capacitors samples pixel and reset signals from a selected row while a second pair of sample and hold capacitors outputs previously sampled pixel and reset signals to an output line;
   wherein one or more dummy columns is present on either side of the paired readout columns; wherein
   one of the dummy columns comprises a vertical signal bus controllably connected to the same and hold capacitors in each readout column which store pixel signals and a second dummy column comprises a vertical signal bus controllably connected to the same and hold capacitors in each readout column which store reset signals;
   wherein each dummy column comprises at least one line of shielding; and
   wherein at least one line of shielding separates each of the dummy and readout columns from its adjoining columns.

2. The ping-pong readout circuit of claim 1, wherein one dummy column is present on either side of the paired readout columns.

3. The ping-pong readout circuit of claim 1, wherein each dummy column comprises three lines of shielding.

4. The ping-pong readout circuit of claim 1, wherein the shielding lines comprise metal or poly shielding material.

5. A method of operating a ping-pong readout circuit that comprises two side-by-side readout columns, wherein each column comprises two pairs of sample and hold capacitors and is configured to operate in ping-pong readout mode wherein a first pair of sample and hold capacitors samples pixel and reset signals from a selected row while a second pair of sample and hold capacitors outputs previously sampled pixel and reset signals to an output line; wherein one or more dummy columns is present on either side of the paired readout columns; wherein one of the dummy columns comprises a vertical signal bus controllably connected to the sample and hold capacitors in each readout column which store pixel signals and a second dummy column comprises a vertical signal bus controllably connected to the sample and hold capacitors in each readout column which store reset signals; wherein each dummy column comprises at least one line of shielding; and wherein at least one line of shielding separates each of the dummy and readout columns from its adjoining columns, the method including turning off a control signal which enables sampling of pixel output to sample and hold capacitors prior to turning off a control signal which enables output of previously sampled signals on an opposing pair of sample and hold capacitors.

6. A method of operating a ping-pong readout circuit that comprises two side-by-side readout columns, wherein each column comprises two pairs of sample and hold capacitors and is configured to operate in ping-pong readout mode wherein a first pair of sample and hold capacitors samples pixel and reset signals from a selected row while a second pair of sample and hold capacitors outputs previously sampled pixel and reset signals to an output line; wherein one or more dummy columns is present on either side of the paired readout columns; wherein one of the dummy columns comprises a vertical signal bus controllably connected to the sample and hold capacitors in each readout column which store pixel signals and a second dummy column comprises a vertical signal bus controllably connected to the sample and hold capacitors in each readout column which store reset signals; wherein each dummy column comprises at least one line of shielding; and wherein at least one line of shielding separates each of the dummy and readout columns from its adjoining columns, the method including outputting signals to an analog-to-digital converter (ADC) and overlapping of a sampling phase on one set of sample and hold capacitors and readout of an opposing pair of sample and hold capacitors is performed while the ADC is in a reset phase.

* * * * *